United States Patent [19]

Lagoni

[11] 4,181,915
[45] Jan. 1, 1980

[54] LED CHANNEL NUMBER DISPLAY RESPONSIVE TO AMBIENT LIGHT LEVEL

[75] Inventor: William A. Lagoni, Indianapolis, Ind.

[73] Assignee: RCA Corporation, New York, N.Y.

[21] Appl. No.: 890,882

[22] Filed: Mar. 27, 1978

[51] Int. Cl.² .................. H04N 9/535; H04N 5/58
[52] U.S. Cl. ................................ 358/27; 358/161; 358/192
[58] Field of Search ............... 358/192, 191, 161, 27, 358/21, 39; 325/455, 464, 465, 406; 58/50 R, 23 C, 23 A; 340/336

[56] References Cited

U.S. PATENT DOCUMENTS

| | | | |
|---|---|---|---|
| 3,757,511 | 9/1973 | Burgess et al. | 58/50 R |
| 3,765,163 | 10/1973 | Levine et al. | 58/23 A |
| 3,961,361 | 6/1976 | Avins et al. | 358/161 |

OTHER PUBLICATIONS

Breeze, "A Frequency Synthesizer for Television Receivers", Transactions BTR, Nov. 1974, pp. 259-263.

Mostek, MOS Clock Radio Circuit, MK50380N, Jan. 1975, 7 pages.

*Primary Examiner*—John C. Martin
*Attorney, Agent, or Firm*—Eugene M. Whitacre; Paul J. Rasmussen; Peter M. Emanuel

[57] ABSTRACT

A television receiver includes a light emitting diode channel number display. The supply voltage for the display is developed by an amplifier in response to a control voltage generated by a control circuit including a light sensing element for controlling the contrast and color level properties of the picture produced by the receiver as a direct function of the ambient light in the receiver's environment. The amplifier is arranged so that the supply voltage for the LED channel number display, and therefore its illumination, is a direct function of the ambient light and tracks the contrast and color level properties of the picture. In addition, the gain of the amplifier is selected so that the photometric brightness of the LED channel number display as perceived by a viewer is attenuated with respect to the photometric brightness of the picture as perceived by a viewer.

10 Claims, 2 Drawing Figures

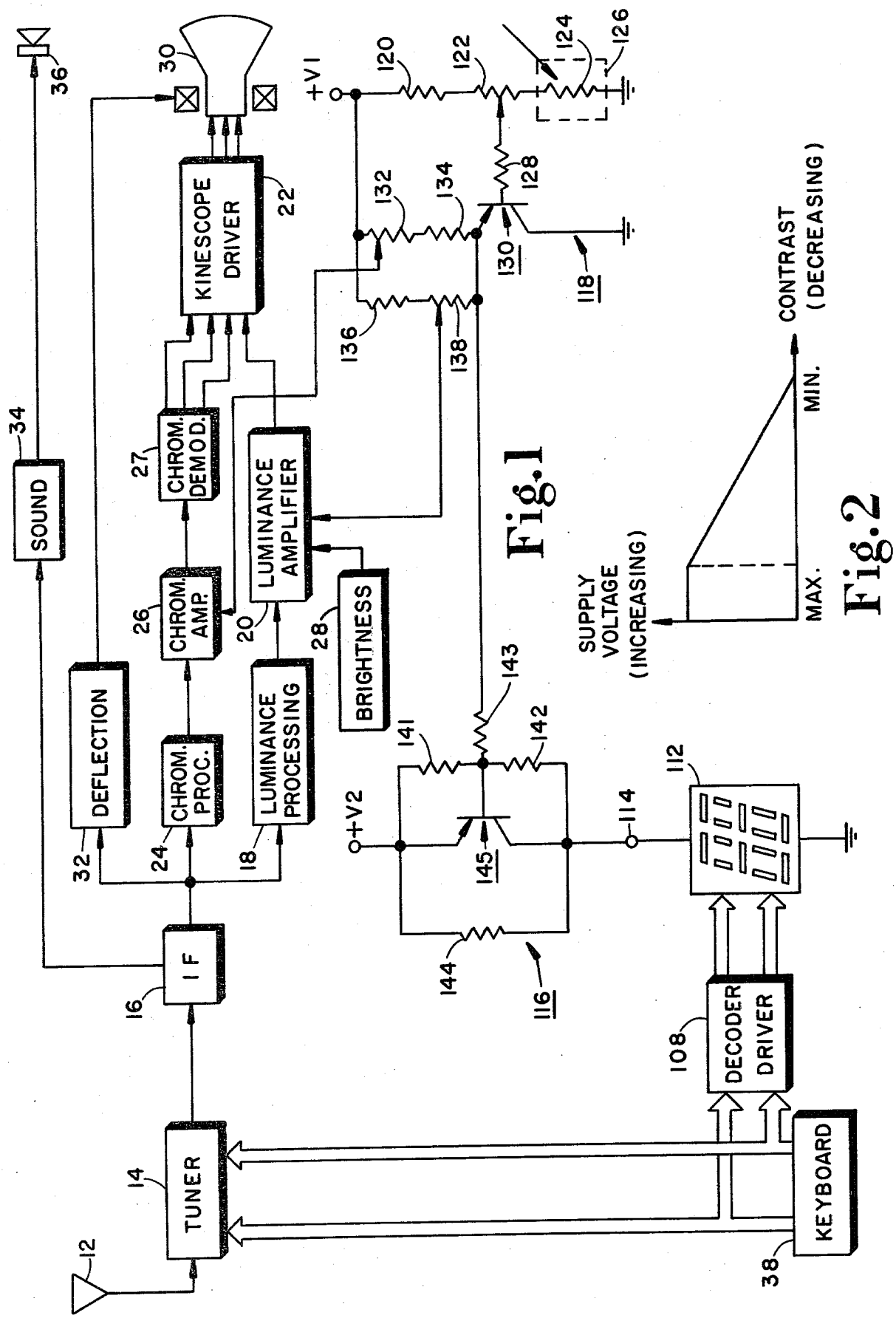

LED CHANNEL NUMBER DISPLAY RESPONSIVE TO AMBIENT LIGHT LEVEL

BACKGROUND OF THE INVENTION

The present invention relates to the field of channel number displays. A variety of tuning systems for television receivers are known in which channel numbers of selected channels are illuminated by an artificial light source. For example, in conventional mechanical turret type tuners, a pilot light is positioned behind a member with translucent channel numbers to illuminate the channel number of a channel selected by turning the turret to a predetermined position. In more recent digital type tuners, selected light emitting diodes of two arrays, each including seven light emitting diodes arranged to form the number eight, are selectively illuminated in response to binary signals representing the tens digit and the units digit of a selected channel number.

One of the deficiencies of such channel number display systems is that the luminance or photometric brightness (as defined in the "IES Lighting Handbook", Fourth Edition, published by the Illuminating Engineering Society) of the illuminated channel number display as perceived by a viewer with respect to the photometric brightness of the picture produced by the receiver, as perceived by the viewer, may be so disconcerting as to distract the viewer's attention away from the picture produced by the receiver, especially under low ambient light conditions. While light emitting diode display systems with light sensing circuitry to reduce the brightness of the display under low ambient light conditions are known in such applications as digital clocks, such provisions would tend not to be acceptable in the environment of a television receiver for reducing the distracting effect of light emitting diode channel number display systems. Such systems tend to add the cost and complexity of extra components. Moreover, it is desirable to control the photometric brightness of the channel number display not merely in response to the ambient light conditions but also in relation to the photometric brightness of the picture.

SUMMARY OF THE PRESENT INVENTION

In a television receiver, including an illuminating element for displaying the channel number of a selected channel and picture property determining means for controlling at least one picture property, e.g., contrast, color level and/or brightness, directly related to the photometric brightness of the image produced by the receiver, control means for controlling the picture property in direct relationship to the ambient light in the environment of the receiver is coupled to power supplying means for supplying power to the channel number illuminating element to control the photometric brightness of the illuminating element in a direct relationship to the ambient light. The control means may include manually operable means for allowing a viewer to control the picture property which is arranged so that the channel number illuminating element is similarly affected with respect to photometric brightness. Desirably, the power supplying means is arranged to effectively attenuate the photometric brightness of the channel number illuminating element as perceived by the viewer with respect to the photometric brightness of the image produced by the receiver as perceived by the viewer throughout the range of the ambient light.

BRIEF DESCRIPTION OF THE DRAWING

FIG. 1 shows partially in block diagram form and partially in schematic diagram form an embodiment of the present invention; and FIG. 2 shows a control characteristic of the embodiment of the present invention shown in FIG. 1.

DETAILED DESCRIPTION OF THE DRAWING

In FIG. 1, a television receiver receives RF signals from an antenna 12. The RF signals are coupled to a tuner 14 where they are combined with a local oscillator signal having a frequency controlled in accordance with the channel selected by a viewer to produce an IF signal. The IF signal is coupled to an IF signal processing portion 16. A portion of the IF signal is coupled to a luminance processing circuit 18 which removes luminance signals representing picture transition and tone information from the IF signal. The luminance signals are amplified by a luminance amplifier 20 and coupled to a kinescope driver 22. Another portion of the IF signal is coupled to a chrominance processing circuit 24 which removes chrominance signals representing picture color information from the IF signals. The chrominance signals are amplified by a chrominance amplifier 26. The amplifier chrominance signals are demodulated by a chrominance demodulator 27 to form red, green and blue color difference signals. Kinescope driver 22 includes three amplifier arrangements (not shown) for combining the color difference signals with the luminance signals to produce color signals representing red, green and blue picture information. A brightness control unit 28 couples a DC signal to luminance amplifier 20 to control the DC component of the signal applied to the amplifier arrangements of kinescope driver 22 with respect to their cutoff points. The color signals are coupled to a kinescope 30 which, in response, produces three corresponding electron beams. Still another portion of the IF signal is coupled to deflection circuitry 32 which generates signals to control the horizontal and vertical deflection of the three electron beams to produce an image on the screen of kinescope 30. Sound signals derived from still another portion of the IF signal are processed by a sound processing unit 34 and converted to an audio response by a speaker 36.

The DC signal generated by brightness control unit 28 is controllable by means of a potentiometer (not shown) and is related to the black level or, as it is more conventionally referred to, the brightness of the image produced by kinescope 30. The gain of luminance amplifier 20 is controllable and is directly related to the contrast of the picture produced by kinescope 30. Similarly, the gain of chrominance amplifier 26 is controllable and is directly related to the color intensity of the reds, greens and blues in the picture. The gains of luminance amplifier 20 and chrominance amplifier 26 are controlled in inverse relationship to respective DC control signals generated by a control circuit 118.

Specifically, control circuit 118 includes a resistor 120, a potentiometer 122 and a light dependent resistor 124 connected in series between a source of supply voltage $+V1$ and signal ground. Light dependent resistor 124 is mounted on an external portion 126 of the receiver to receive ambient room light. The wiper of potentiometer 122 is coupled through a resistor 128 to the base of a PNP transistor arranged in common emitter configuration. A potentiometer 132 and a resistor 134 are connected in series between supply voltage +V1 and the emitter of transistor 130. The wiper of potentiometer 132 is coupled to chrominance amplifier 26. A resistor 136 and a potentiometer 138 are also connected in series between supply voltage +V1 and the collector of transistor 130. The wiper of potentiometer 138 is connected to luminance amplifier 20.

In operation, as the level of ambient light decreases, the resistance of light dependent resistor 124 increases. As a result, the voltages developed at the wiper of potentiometer 122, the emitter of transistor 130 and the wiper arms of potentiometers 132 and 138 increase. Since luminance amplifier 20 and chrominance amplifier 26 have gains which are inversely related to the DC control signals generated by control circuit 118, the gains of luminance amplifier 20 and chrominance amplifier 26 decrease as the ambient light received by light dependent resistor 124 decreases. Conversely, as the ambient light increases the gains of luminance amplifier 20 and chrominance amplifier 26 are increased. As a result, since the picture contrast is directly related to the gain of luminance amplifier 20 and the color intensity is directly related to the gain of chrominance amplifier 26, the contrast and color intensity are simultaneously controlled as a direct function of the ambient light. The gain tracking of the luminance and chrominance amplifier 26 is desirable to insure proper color reproduction under varying light conditions.

Potentiometer 138 allows for factory adjustment of the gain of luminance amplifier 20 to limit the maximum picture contrast under high ambient light conditions. Potentiometer 132 allows for viewer control of the color level relative to the contrast setting. Potentiometer 122 allows for simultaneous viewer control of both contrast and color level.

Various portions of the receiver described so far may comprise components similar to those disclosed in U.S. Pat. No. 3,961,361 and also in RCA Television Service Data, File 1976 C-4 for the CTC-74 series chassis, published by RCA Corporation, Indianapolis, Indiana, both hereby incorporated by references.

Channels are selected by means of a keyboard 38. Keyboard 38 includes push buttons (not shown) corresponding to decimal digits 0 through 9. A viewer sequentially depresses the push buttons corresponding to the two decimal digits of the desired channel number. In response, a first group of four binary signals arranged in binary coded decimal (BCD) format representing the tens digit and a second group of four binary signals arranged in BCD format representing the units digit are generated by keyboard 38. Tuner 14 converts the binary signals representing the selected channel number to a local oscillator signal having the appropriate frequency for tuning the receiver to the selected channel. For this purpose, tuner 14 may include a phase locked loop tuning system of the type disclosed in U.S. Pat. No. 4,031,549, hereby incorporated by reference.

The binary signals representing the channel number are also coupled to a display decoder/driver 108. Display decoder/driver 108 converts the first and second groups of four binary signals each to third and fourth groups of seven signals each. The third and fourth groups of signals are coupled to the tens and units digit positions, respectively, of a two digit, seven segment light emitting diode (LED) channel number display unit 112. Supply voltage for channel number display 112 is coupled to a supply voltage terminal 114. The seven signals in each of the fourth and fifth groups correspond to respective bar segments of the corresponding digit position. The particular number formed in a digit position depends on which of the bar segments are energized. For example, the number 8 is formed in a digit position when all the bar segments are energized. Red LED channel number display units suitable for use as channel number display 112 are commercially available from National Semiconductor Corporation under part number NSN500, and decoder/driver units suitable for use as decoder/driver 108 are commercially available also from National Semiconductor Corporation under part number DS7669.

The supply voltage for LED channel number display 112 is derived by an amplifier 116 in response to the control voltage representing the ambient light conditions developed at the emitter of transistor 130 of control circuit 118. Specifically, amplifier 116 includes a PNP transistor 145 arranged in common emitter configuration. A resistor 143 is connected between the emitter of transistor 130, which is the output of control circuit 118, and the base of transistor 145, which is the input of amplifier 116. The collector of transistor 145, which is the output of amplifier 116, is connected to supply voltage terminal 114 of LED channel number display 112. A supply voltage +V2 is coupled to the emitter of transistor 145. A resistor 141 is connected between the base and emitter of transistor 145. A resistor 142 is connected between the base and collector of transistor 145. A resistor 144 is connected between the emitter and collector of transistor 145.

Amplifier 116 is an inverting amplifier. As the control voltage developed at the emitter of transistor 130 increases, the supply voltage coupled to supply terminal 114 of LED channel number display 112 decreases. Therefore, since the control voltage is inversely related to the ambient light, the supply voltage coupled to LED channel number display 112 is directly related to the ambient light. The supply voltage of LED channel number display 112 is directly related to the photometric brightness or luminance of LED channel number display 112. As defined in the "IES Lighting Handbook", fourth edition, published by the Illuminating Engineering Society, photometric brightness or luminance is: "the luminous flux per unit of projected area and unit solid angle either leaving a surface at a given point in a given direction or arriving at a surface in a given point from a given direction".

Thus, the photometric brightness of LED channel number display 112 is directly related to the ambient light in the environment of the receiver. Moreover, since the gains of luminance amplifier 20 and chrominance amplifier 26 are controlled in inverse relationship to the control voltage developed at the emitter of transistor 130 of control circuit 118, the photometric brightness of LED channel number display 112 tracks the contrast and color level of the image produced by kinescope 30. It is noted that in this respect, the photometric brightness of LED channel number display 112 tracks the contrast and color level whether those picture properties are automatically controlled in response to the ambient light or manually controlled, by means of potentiometer 122, in accordance with a viewer's preference. These provisions not only tend to reduce the disconcerting characteristic of LED channel number display 112 in low ambient light environments, but also tends to reduce the distracting characteristic of LED channel number display 112 in relationship to the contrast and color level picture properties.

To further reduce the distracting characteristic of LED channel number display 112 in relationship to the contrast and color level picture properties, the gain of amplifier 116 is selected so that the photometric brightness of LED channel number display 112 as perceived by the viewer is attenuated with respect to the photometric brightness of the image produced by kinescope 30 as perceived by the viewer throughout the control range of the control voltage. The photometric brightness of the image, of course, increases with increases in contrast and color level. This feature of the present arrangement may be qualitatively examined by placing a light filter having the response characteristic of the human eye between LED channel number display 112 and an instrument for measuring photometric brightness and then repeating the measurement in front of the screen of kinescope 30 and comparing the results. The gain of amplifier 116 is determined by the ratio of the value of resistor 142 to the value of resistor 145.

It has also been found that the distracting effect of LED channel number display 112 with respect to the image produced by kinescope 30 is effectively reduced if amplifier 116 is arranged to provide a relatively constant supply voltage to LED channel number display 112 when the contrast is in a region near its maximum value even though the control voltage is changing and thereby changing the contrast and color levels accordingly. This is graphically illustrated in FIG. 2. To accomplish this property of amplifier 116, the values of resistors 143 and 141 are selected so that for relatively low values of control voltage, corresponding to relatively large values of contrast and color level, transistor 145 is in saturation and for large values of control voltage, transistor 145 operates in its linear region.

Amplifier 116 has a relatively low output impedance by virtue of the negative feedback provided by resistor 142. Because of the low output impedance of amplifier 116, the supply voltage at terminal 114, at a particular level of control voltage, remains substantially constant independent of the number of segments which are illuminated.

Resistor 144 is provided to reduce the current flowing through the emitter-collector junction of transistor 145 when the value of control voltage is relatively high and, as a result, the supply voltage is relatively low. As a result, the power dissipation of transistor 145 is reduced.

While the channel number display apparatus of FIG. 1 includes a control circuit 118 for controlling luminance amplifier 20 and chrominance amplifier 26, it should be noted that a control circuit for controlling other picture properties such as the black level or so-called brightness property by controlling the DC level coupled to kinescope driver 22 may also be employed. These and other modifications are intended to be within the scope of the present invention defined in the following claims.

What is claimed is:

1. In a television receiver including tuner means for processing RF signals received by the receiver in accordance with a selected channel to generate IF signals, signal processing means for processing said IF signals to generate luminance and color signals, and a kinescope for generating an image in response to said luminance and color signals, apparatus comprising:

channel number display means including a light emitting element for indicating the channel number of said selected channel;

power supplying means for coupling power to said light emitting element, the amount of power coupled to said light emitting element determining the photometric brightness of said light emitting element;

picture property determining means included in said signal processing means for determining at least one picture property directly related to the photometric brightness of said image produced by said kinescope; and control means including an ambient light sensing element and a setting element for generating a control signal representing the ambient light level in the environment of said receiver and a desired condition of said picture property;

said control signal being coupled to both said picture property determining means and to said power supplying means to simultaneously control said picture property and the photometric brightness of said light emitting element in direct relationship to said ambient light level;

said power supplying means being responsive to said control signal to cause the attenuation of the photometric brightness of said light emitting element as perceived by a viewer with respect to the photometric brightness of said image as perceived by the viewer throughout the range of said control signal.

2. The apparatus recited in claim 1 wherein:
said control means includes manual means for also controlling the generation of said control signal.

3. The apparatus recited in claim 2 wherein:
picture property determining means includes a luminance amplifier for amplifying said luminance signals to determine the contrast of said image and a chrominance amplifier for amplifying the chrominance signals to determine the color level of said image, both of said luminance and chrominance amplifiers having gains controlled in response to said control signal so that said contrast and said color level are directly related to said ambient light level.

4. The apparatus recited in claim 3 wherein:
said channel number display means includes a seven segment light emitting diode array for each digit of said selected channel number and a supply voltage terminal for applying supply voltage to each of said arrays;

said control means generates a control voltage representing said ambient light level; and said power supplying means includes a DC amplifier having an input and an output, said control voltage being coupled to said input, said output being coupled to the supply voltage terminal of said channel number display, said DC amplifier being arranged so that the voltage developed at its output is directly related to said ambient light level.

5. In a television receiver including tuner means for processing RF signals received by the receiver in accordance with a selected channel to generate IF signals, signal processing means for processing said IF signals to generate luminance and color signals, and a kinescope for generating an image in response to said luminance and color signals, apparatus comprising:

channel number display means including a light emitting element for indicating the channel number of said selected channel;

power supplying means for coupling power to said light emitting element, the amount of power coupled to said light emitting element determining the photometric brightness of said light emitting element;

picture property determining means included in said signal processing means for determining at least one picture property directly related to the photometric brightness of said image produced by said kinescope; and control means including an ambient light sensing element and a setting element for generating a control signal representing the ambient light level in the environment of said receiver and a desired condition of said picture property;

said control signal being coupled to both said picture property determining means and to said power supplying means to simultaneously control said picture property and the photometric brightness of said light emitting element in direct relationship to said ambient light level;

said power supplying means being responsive to said control signal to cause the attenuation of the photometric brightness of said light emitting element as perceived by a viewer with respect to the photometric brightness of said image as perceived by the viewer;

said power supplying means including a DC amplifier for coupling a supply voltage having a direct relationship to said ambient light level to said light emitting element, said DC amplifier being arranged so that said supply voltage remains substantially constant as a function of said control signal when said picture property has a value in a predetermined region near its maximum value.

6. The apparatus recited in claim 5 wherein:

picture property determining means includes a luminance amplifier for amplifying said luminance signals to determine the contrast of said image and a chrominance amplifier for amplifying the chorminance signals to determine the color level of said image, both of said luminance and chrominance amplifiers having gains controlled in response to said control signal so that said contrast and said color level are directly related to said ambient light level; and said DC amplifier is arranged so that said supply voltage remains substantially constant as a function of said control signal when said contrast has a value in a predetermined region near its maximum value.

7. The apparatus recited in claim 6 wherein:

said control voltage is an inverse function of said ambient light;

said amplifier includes a transistor having base, emitter, and collector electrodes, said emitter electrode being coupled to a source of fixed DC voltage, said collector electrode being coupled to said supply voltage terminal of said channel number display, said base electrode being coupled to said emitter through a first resistor, said base being coupled to said collector through a second resistor, and said control voltage being coupled to said base through a third resistor.

8. The apparatus recited in claim 7 wherein:

said first and third resistors are selected so that said transistor is substantially saturated in response to said control voltage when said contrast has a value in said predetermined region near its maximum value.

9. The apparatus recited in claim 8 wherein:

said second and third resistors are selected to establish the gain of said DC amplifier at a value so that the photometric brightness of said channel number display as perceived by said viewer is attenuated with respect to the photometric brightness of said image as perceived by said viewer.

10. The apparatus as recited in claim 9 wherein:

a fourth resistor is coupled between said collector and said emitter, said fourth resistor being selected to reduce the current flowing through said transistor to said channel number display when the voltage difference between said fixed DC voltage and the voltage developed at said output terminal is relatively large.

* * * * *

UNITED STATES PATENT AND TRADEMARK OFFICE
CERTIFICATE OF CORRECTION

PATENT NO. : 4,181,915

DATED : January 1, 1980

INVENTOR(S) : William Adamson Lagoni

It is certified that error appears in the above-identified patent and that said Letters Patent is hereby corrected as shown below:

In the References: Mostek "7 pages" should be -- 6 pages--.
Col. 2, line 26, "amplifier" should be --amplified--.

Signed and Sealed this

Eighteenth Day of March 1980

[SEAL]

Attest:

SIDNEY A. DIAMOND

Attesting Officer     Commissioner of Patents and Trademarks